United States Patent
Wang et al.

(10) Patent No.: US 9,232,674 B2
(45) Date of Patent: Jan. 5, 2016

(54) COVER STRUCTURE AND ELECTRONIC DEVICE USING THE SAME

(71) Applicant: PEGATRON CORPORATION, Taipei (TW)

(72) Inventors: Chi-Han Wang, Taipei (TW); Tzu-Pin Chao, Taipei (TW); Ying-Chen Ho, Taipei (TW); Shu-Yin Pan, Taipei (TW)

(73) Assignee: PEGATRON CORPORATION, Taipei (TW)

( * ) Notice: Subject to any disclaimer, the term of this patent is extended or adjusted under 35 U.S.C. 154(b) by 197 days.

(21) Appl. No.: 13/944,140

(22) Filed: Jul. 17, 2013

(65) Prior Publication Data

US 2014/0055927 A1    Feb. 27, 2014

(30) Foreign Application Priority Data

Aug. 24, 2012 (TW) .............................. 101130918 A

(51) Int. Cl.

| | |
|---|---|
| *G06F 1/16* | (2006.01) |
| *H05K 5/00* | (2006.01) |
| *H05K 7/00* | (2006.01) |
| *H04M 1/00* | (2006.01) |
| *B65D 85/00* | (2006.01) |
| *H04M 1/04* | (2006.01) |
| *H04M 1/725* | (2006.01) |
| *H04M 1/02* | (2006.01) |
| *A45C 11/00* | (2006.01) |

(52) U.S. Cl.
CPC *H05K 7/00* (2013.01); *A45C 11/00* (2013.01); *G06F 1/1626* (2013.01); *G06F 1/1628* (2013.01); *H04M 1/0214* (2013.01); *H04M 1/04* (2013.01); *H04M 1/72575* (2013.01); *A45C 2011/002* (2013.01); *G06F 2200/1633* (2013.01); *H04M 2250/22* (2013.01)

(58) Field of Classification Search
CPC ........................................................ H05K 7/00
See application file for complete search history.

(56) References Cited

U.S. PATENT DOCUMENTS

| | | | | |
|---|---|---|---|---|
| 4,703,161 | A * | 10/1987 | McLean ......................... 235/1 D |
| 7,194,291 | B2 * | 3/2007 | Peng ........................... 455/575.8 |
| D553,352 | S * | 10/2007 | Allen .............................. D3/218 |
| 7,343,184 | B2 * | 3/2008 | Rostami ...................... 455/575.8 |
| 7,444,176 | B2 * | 10/2008 | Oda et al. .................... 455/575.3 |

(Continued)

FOREIGN PATENT DOCUMENTS

| | | |
|---|---|---|
| TW | M417750 U | 12/2011 |
| TW | M422893 U | 2/2012 |

OTHER PUBLICATIONS

English translation of abstract of TW M417750 (published Dec. 1, 2011).

(Continued)

*Primary Examiner* — Hoa C Nguyen
*Assistant Examiner* — Xanthia C Cunningham
(74) *Attorney, Agent, or Firm* — McClure, Qualey & Rodack, LLP

(57) ABSTRACT

A cover structure for an electronic device comprises a protective cover and a touch element. The protective cover is connected with the electronic device, and the protective cover is capable of being rotated with respect to the electronic device to a front side or a rear side of the electronic device. The touch element is disposed at the protective cover and can be exerted by an external force to touch the electronic device and activate corresponding functions of the electronic device.

13 Claims, 8 Drawing Sheets

(56) References Cited

U.S. PATENT DOCUMENTS

| | | | |
|---|---|---|---|
| 7,643,274 B2* | 1/2010 | Bekele | 361/679.02 |
| 7,886,903 B1* | 2/2011 | Wurzelbacher et al. | 206/320 |
| 8,264,310 B2* | 9/2012 | Lauder et al. | 335/219 |
| 8,310,826 B2* | 11/2012 | Wu et al. | 361/679.3 |
| 8,393,466 B2* | 3/2013 | Rayner | 206/320 |
| 8,824,126 B2* | 9/2014 | Kurihara et al. | 361/679.01 |
| 2003/0160754 A1* | 8/2003 | Hanson et al. | 345/156 |
| 2006/0160586 A1* | 7/2006 | Cheng | 455/575.8 |
| 2006/0175370 A1* | 8/2006 | Arney et al. | 224/666 |
| 2006/0226040 A1* | 10/2006 | Medina | 206/320 |
| 2007/0135184 A1 | 6/2007 | Pletikosa | |
| 2007/0201689 A1* | 8/2007 | Uramoto et al. | 379/451 |
| 2008/0272025 A1* | 11/2008 | Lee | 206/701 |
| 2009/0211775 A1* | 8/2009 | Yamaguchi et al. | 174/50.5 |
| 2009/0215412 A1* | 8/2009 | Liu et al. | 455/90.3 |
| 2010/0072090 A1* | 3/2010 | Krishnan et al. | 206/308.2 |
| 2011/0240516 A1* | 10/2011 | Fan | 206/701 |
| 2012/0018325 A1 | 1/2012 | Kim | |
| 2012/0039023 A1* | 2/2012 | Renwick | 361/679.01 |

OTHER PUBLICATIONS

English translation of abstract of TW M422893 (published Feb. 21, 2012).

* cited by examiner

COVER STRUCTURE AND ELECTRONIC DEVICE USING THE SAME

CROSS-REFERENCE TO RELATED APPLICATIONS

This Non-provisional application claims priority under 35 U.S.C. §119(a) on Patent Application No(s). 101130918 filed in Taiwan, Republic of China on Aug. 24, 2012, the entire contents of which are hereby incorporated by reference.

BACKGROUND

1. Field of the Invention

This invention relates to an electronic device and, more particularly, to an electronic device capable of being operated directly through a protective cover.

2. Description of the Related Art

As time progresses and busy life, mobile electronic devices have become the necessary products in the modern life. For example, mobile communicational devices not only can be used to communicate but also be a notebook or be operated program as the development and progressing of the human being.

In order to operate more directly, the size of the screen has been increased as the mobile phone development as well as the touch panel has been widely used. It is more convenient to operate while the size of the screen is increased; however, there are more chances to scratch the screen.

In order to effectively protect the screen from scratching, most users will buy an additional protective cover to cover on the touch panel for avoiding the mobile phone from the scratch due to the collision by other sharp things in the bags or other places when the mobile phone is placed therein. However, the method will be not convenient for the user even though it can be well avoid the damage of the touch panel. For example, when there is an incoming call, the user needs to open the protective cover and then touch the touch panel to operate the mobile phone.

Moreover, the user cannot read the information on the screen directly when the cover is covered on the touch panel. That is, the user needs to open the protective cover and then check the incoming call or other information. Thus, how to improve the design between the mobile phone and the protective cover thus to allow the mobile phone easier to be used and reduce the unnecessary operation is an issue for inventors of the present invention and persons who are engaged in the related art.

BRIEF SUMMARY OF THE INVENTION

According to the above, the present invention provides a cover structure for an electronic device, and the cover structure comprises a protective cover and a touch element. The protective cover is connected with the electronic device, and the protective cover is capable of being rotated with respect to the electronic device to a front side or a rear side of the electronic device. The touch element is disposed at the protective cover and can be exerted by an external force to touch the electronic device and activate corresponding functions of the electronic device.

Preferably, the protective cover further comprises a covering surface, and the touch element is disposed on the covering surface. The electronic device further comprises a touch surface, and the covering surface faces the touch surface when the protective covers the touch surface. Moreover, the touch element further comprises a resistive touch element for touching the electronic device. Also, the touch element can comprise a capacitive touch element for touching the electronic device.

The present invention further provides an electronic device, and the electronic device comprises a main body, a protective cover and a touch element. The main body includes a touch surface. The protective cover is connected with the main body and is capable of being rotated with respect to the main body to a front side or a rear side of the main body and on the touch surface. The touch element is disposed at the protective cover corresponding to an interface unit of the touch surface. When the protective cover covers the touch surface, the touch element can be exerted by an external force to touch the interface unit and execute corresponding functions of the interface unit.

In addition, the present invention further comprises a connecting element for connecting the protective cover on the main body. The main body further comprises a back plate. One end of the connecting element is connected with the back plate and the other end of the connecting element is connected with the protective cover. Besides, the present invention further comprises a back cover connected with the connecting element. The back cover is engaged with the main body for protecting a rear surface of the main body. The back cover further comprises a clip for clipping and fixing the main body.

The protective cover of the present invention further comprises an opening for showing information of the touch surface. The protective cover further comprises a transparent plate to close the opening for protecting the touch surface. Accordingly, the present invention further comprises a camera lens disposed at the rear surface of the main body. When the protective cover rotatably covers the rear surface, the opening is located corresponding to the camera lens for showing the camera lens.

In the following embodiments, the features and advantages of the present invention will be described in sufficient detail for any person skilled in the art to understand and carry out the contents of the present invention. According to details, claims and figures disclosed in the specification, any person skilled in the art can easily understand the object and advantages of the present invention.

DETAILED DESCRIPTION OF THE INVENTION

Figure 1:
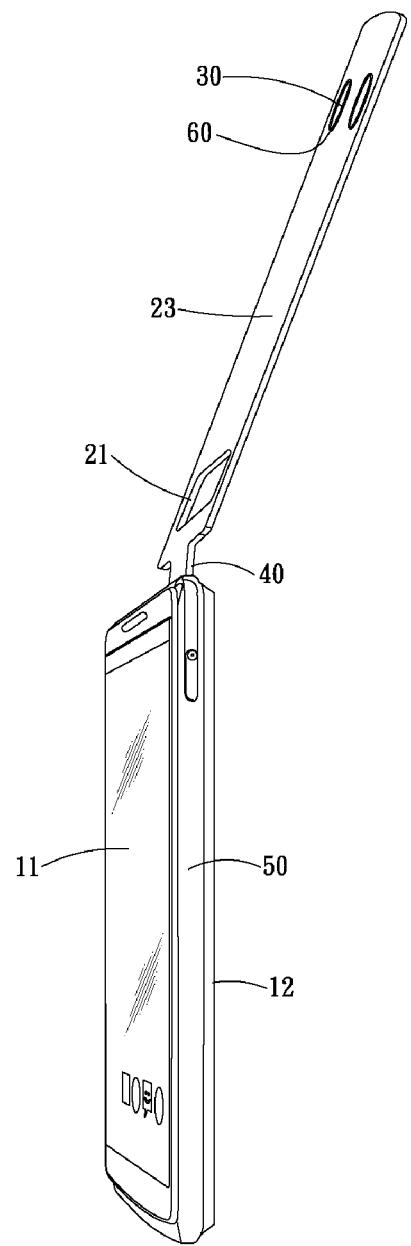
FIG. 1 is a schematic diagram showing a cover structure and an electronic device according to the present invention.

Please refer to FIG. 1. FIG. 1 is a schematic diagram showing a cover structure and an electronic device according to the present invention. The cover structure of the present invention comprises a protective cover 20 and a touch element 30.

The protective cover 20 is a flat plate with an approximately rectangular appearance and used to be connected with an electronic device 50, such as a mobile communication device. Accordingly, the size and the appearance of the protective cover 20 are preferably designed corresponding to the electronic device 50 and have the same area with the electronic device 50. The protective cover 20 is connected with the electronic device 50 by one side thereof and capable of being rotated with respect to the electronic device 50 by using the mutually connected side as an axis. As to the direction of the rotation, the protective cover 20 can be rotated to a front side of the electronic device 50 or the same horizontal plane with the electronic device 50. The protective cover 20 also can be further rotated to a rear side of the electronic device 50 to allow the protective cover 20 to stay close to the rear surface of the electronic device 50. Moreover, when the protective cover 20 covers the electronic device 50, the electronic device 50 can be protected from scratching by foreign matters. Also, the protective cover 20 can be opened and rotated by using the mutually connected side as the axis to the front side or the rear side of the electronic device 50 so as to operate the electronic device 50.

Figure 2:
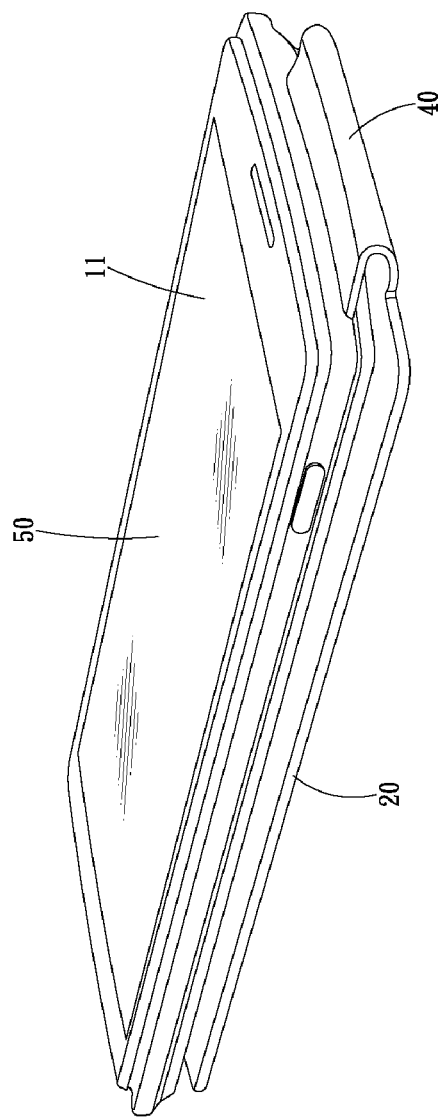
FIG. 2 is a diagram showing the operation of the cover structure according to the present invention.

Please refer to FIG. 2. FIG. 2 is a diagram showing the operation of the cover structure according to the present invention. The cover structure of the present invention further comprises a connecting element 40. One end of the connecting element 40 is connected with one side of the protective cover, and the other end of the connecting element 40 is connected with the electronic device 50. Accordingly, the connecting element 40 is preferably composed of a soft material with flexibility, such as leather products or fabric products, and the protective cover 20 can be rotated to the other surface of the electronic device 50 through the soft material with flexibility. However, a way of connecting the abovementioned connecting element 40 with the electronic device 50 is preferably performed by inserting the other end of the connecting element 40 into the electronic device 50 for connecting the protective cover 20 with the electronic device 50.

Figure 3:
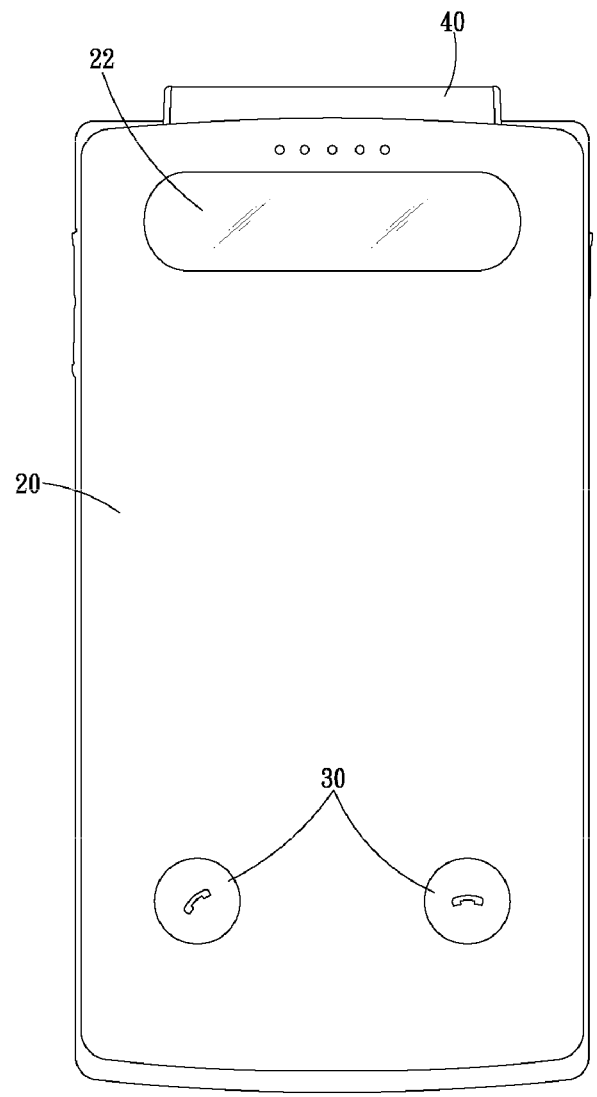
FIG. 3 is a front elevational view showing the cover structure and the electronic device according to the present invention.

Please refer to FIG. 1 and FIG. 3 again. FIG. 3 is a front elevational view showing the cover structure and the electronic device according to the present invention. The protective cover 20 further comprises an opening 21. When the protective cover 20 is connected with the electronic device 50, information displayed on the electronic device 50 can be clearly seen via the opening 21 without opening the protective cover 20. Accordingly, the protective cover 20 preferably has a transparent plate 22, and the size of the transparent plate 22 is provided corresponding to the opening 21 to close the opening 21. Through the configuration of the transparent plate 22, the protection for the electronic device 50 will be enhanced and the damage resulting from users via the opening 21 can be avoided. In the meantime, the information displayed on the electronic device 50 can be seen without opening the protective cover 20.

Figure 4:
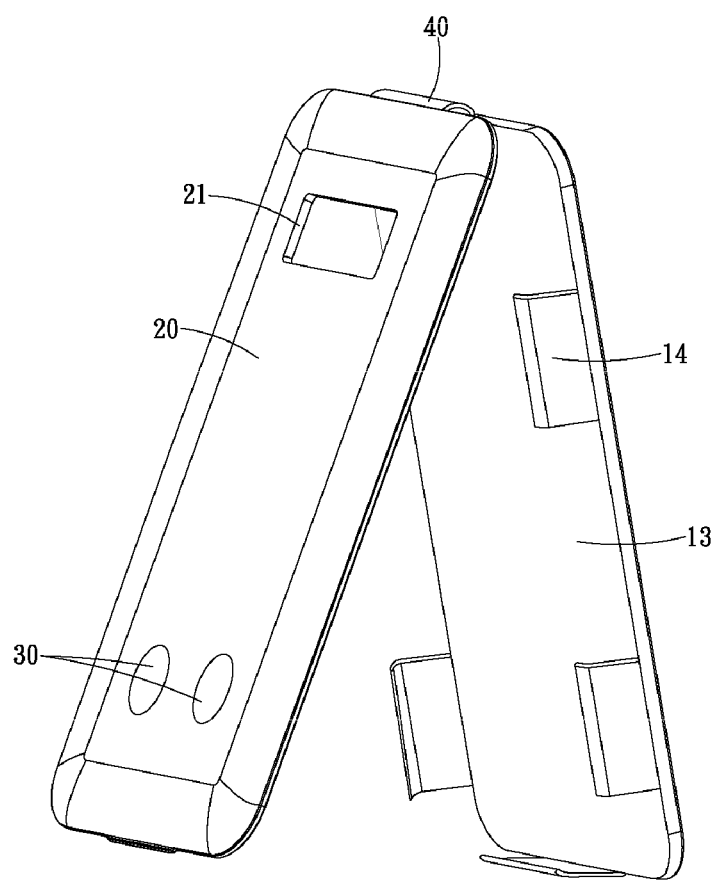
FIG. 4 is a schematic diagram showing the cover structure according to the present invention.
Figure 5:
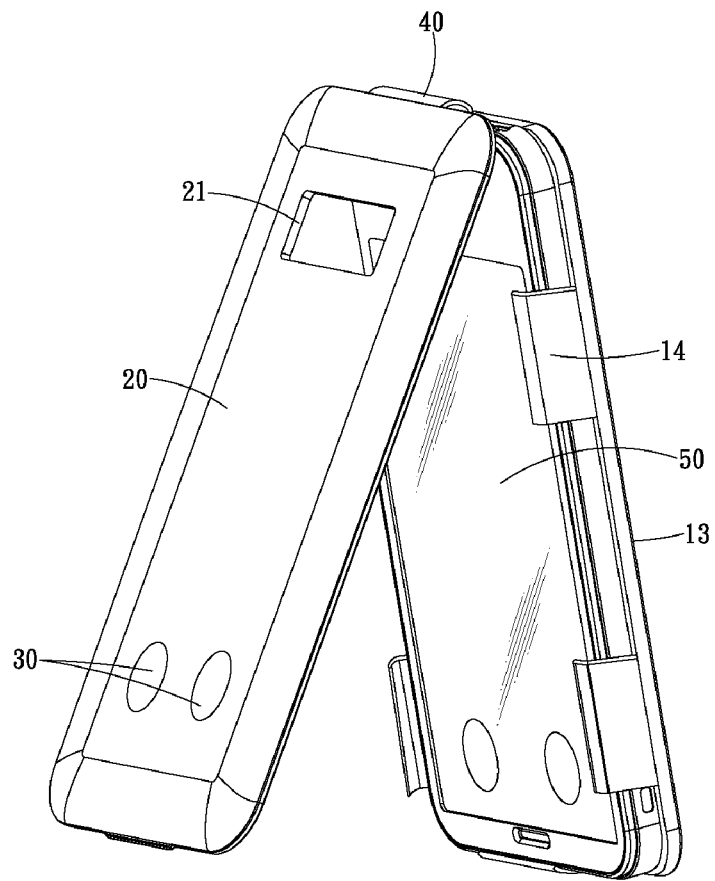
FIG. 5 is a combination schematic diagram showing the cover structure and the electronic structure according to the present invention.

Please refer to FIG. 4 and FIG. 5. FIG. 4 is a schematic diagram showing the cover structure according to the present invention, and FIG. 5 is a combination schematic diagram showing the cover structure and the electronic structure according to the present invention. The cover structure of the present invention further comprises a back cover 13, and the size of the back cover is also provided corresponding to the size of the electronic device 50. The back cover 13 is connected with the connecting element 40. Accordingly, the protective cover 20, the connecting element 40 and the back cover 13 can be formed integrally, but the present invention is not limited thereto. The back cover 13 further comprises clips 14 to clip the electronic device 50 and allow the electronic device 50 to be held on the back cover 13. The connecting element 40 is located at one side of the electronic device 50, and the protective cover 20 is located at the other surface of the electronic device 50 with respect to the back cover 13.

Please further refer to FIG. 1. The touch element 30 is disposed at the protective cover 20. Accordingly, the protective cover 20 further has a covering surface 23, and the touch element 30 is disposed at the covering surface 23. In addition, the electronic device 50 has a touch surface 11, and the covering surface 23 faces the touch surface 11 as the protective cover 20 is rotated to cover the touch surface 11. When the touch element 30 is exerted by an external force to touch the touch surface 11, corresponding functions of the electronic device 50 will be activated. Accordingly, the touch element 30 can be a resistive touch element or a capacitive touch element, and it is chosen according to different panels used on the electronic device 50. For example, the touch element 30 cooperatively can be the resistive touch element and is preferably composed of a metal or plastic material. If the touch surface 11 is a capacitive system, the touch element 30 cooperatively can be the capacitive touch element. Preferably, the capacitive touch element can be a gasket or composed of a plastic material, which is coated with conductive paint on its surface. Also, the capacitive touch element can be composed of conductive fibers, which is doped with metal powders or carbon therein to form a conductor, so as to be cooperated with the capacitive touch surface 11. However, the resistive touch element or the capacitive touch element are only two embodiments, the present invention is not limited thereto.

The covering surface 23 further has a recessed portion 60, and the recessed portion 60 is a portion with an approximately concave appearance for disposing the touch element 30. When the touch element 30 is disposed in the recessed portion 60, an end of the touch element 30 and the covering surface 23 are approximately on a plane. Thus, when the protective cover 20 covers the touch surface 11, the touch element 30 will not directly touch the touch surface 11. When a user exerts a force on one side of the protective cover 20, the touch element 30 will be exerted by the force to touch the touch surface 11.

Figure 6:
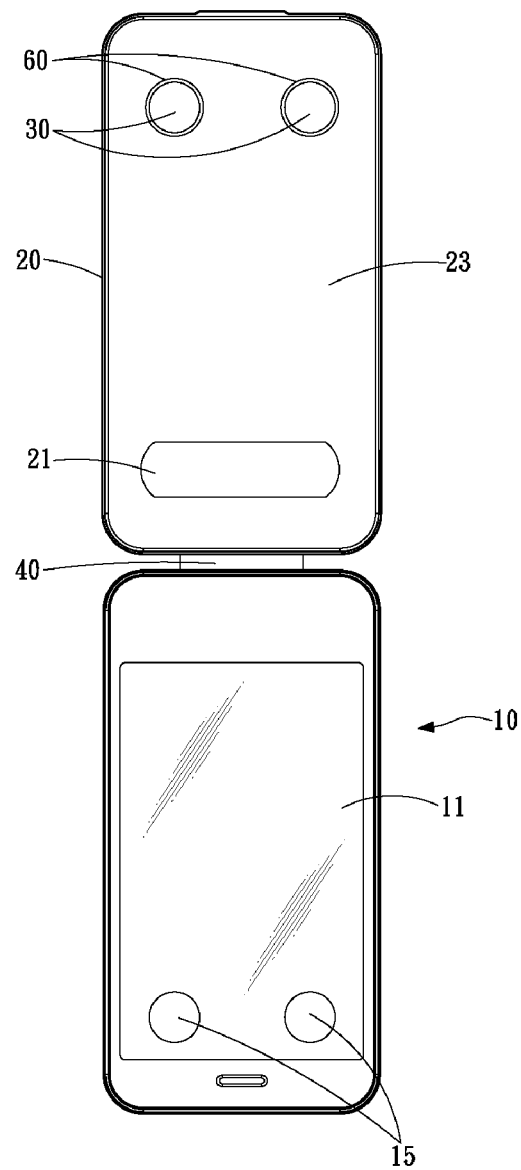
FIG. 6 is a schematic diagram (1) showing the appearance of the electronic device according to the present invention.
Figure 7:
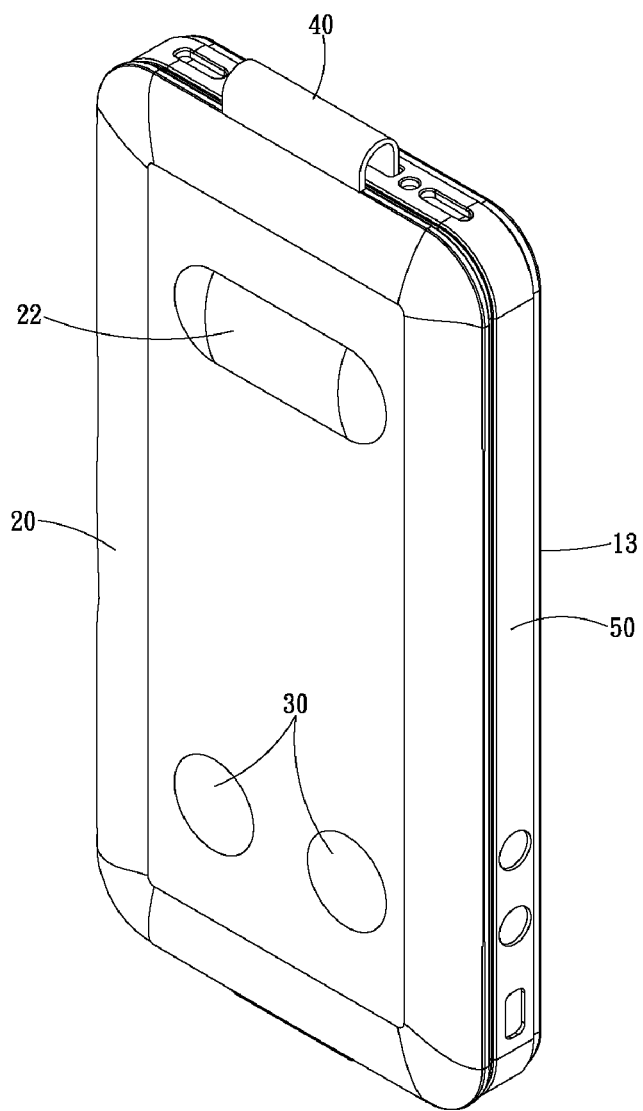
FIG. 7 is a schematic diagram (2) showing the appearance of the electronic device according to the present invention.

Please refer to FIG. 6 and FIG. 7. FIG. 6 is a schematic diagram (1) showing the appearance of the electronic device according to the present invention, and FIG. 7 is a schematic diagram (2) showing the appearance of the electronic device according to the present invention. The electronic device of the present invention comprises a main body 10, a protective cover 20 and a touch element 30.

The main body 10 is a cubic flat plate with an approximately rectangular appearance. One surface of the main body 10 is a touch surface 11, and the touch surface 11 shows different interface units 15. The touch surface 11 is preferably a panel of the capacitive system, which has a capacitive sensor (not shown in the figure). When the screen is touched, a continuous Current will pass through the sensor to allow the sensor to exactly store electrons along a horizontal direction and a vertical direction and form a capacity field with fine control. Accordingly, when the finger touches different positions of the touch surface 11, the normal capacity field of the sensor will be changed by another capacity field so that the panel will act according to this touch.

The abovementioned touch surface 11, which is the panel of the capacitive system, is only an embodiment; the present invention is not limited thereto. The panel of the touch surface 11 also can be the resistive system composed of a conductive layer and a resistive metal layer. The two layers are spaced by a spacer to allow a current to stream between the conductive layer and the resistive metal layer. When the panel of the resistive system is touched, the conductive layer and the resistive metal layer will contact with each other. Thus, the changes of the electric field will be recorded as a touch event, and then the panel will act according to this touch.

The protective cover 20 is a flat plate with an approximately rectangular appearance, and the size and the appearance of the protective cover 20 are preferably designed corresponding to the main body 10 and have the same area with the main body 10. Accordingly, the protective cover 20 further comprises a covering surface 23, and the touch element 30 is disposed at the covering surface 23. The protective cover 20 is connected with the main body 10 by one side thereof and capable of being rotated with respect to the main body 10 by using the mutually connected side as an axis. As to the direction of the rotation, the protective cover 20 can be rotated to a front side of the main body 10 or the same horizontal plane with the main body 10. The protective cover 20 also can be further rotated to a rear side of the main body 10 to allow the protective cover 20 to stay close to the rear surface 12 of the main body 10. Moreover, when the protective cover 20 covers the touch surface 11, the covering surface 23 faces the touch surface 11 so that the protective cover 20 can protect the touch surface 11 from scratching by foreign matters. Also, the protective cover 20 can be opened and rotated by using the mutually connected side as the axis to the rear side 12 of the main body 10.

The electronic device of the present invention further comprises a connecting element 40. One end of the connecting element 40 is connected with one side of the protective cover, and the other end of the connecting element 40 is connected with the main body 10. Accordingly, the connecting element 40 is preferably composed of a soft material with flexibility, such as leather products or fabric products, and the protective cover 20 can be rotated to the other surface of the main body 10 through the soft material with flexibility. However, a way of connecting the abovementioned connecting element 40 with the main body 10 is preferably performed by inserting the other end of the connecting element 40 into the main body 10 for connecting the protective cover 20 with the main body 10.

In addition, the protective cover 20 further comprises an opening 21. When the protective cover 20 is connected with the main body 10, information displayed on the touch surface 11 of the main body 10 can be clearly seen via the opening 21 without opening the protective cover 20. Accordingly, the protective cover 20 preferably has a transparent plate 22, and the size of the transparent plate 22 is provided corresponding to the opening 21 to close the opening 21. Through the configuration of the transparent plate 22, the protection for the touch surface 11 of the main body 10 will be enhanced and the damage resulting from users via the opening 21 can be avoided. In the meantime, the information displayed on the touch surface 11 of the main body 10 can be seen without opening the protective cover 20.

Figure 8:
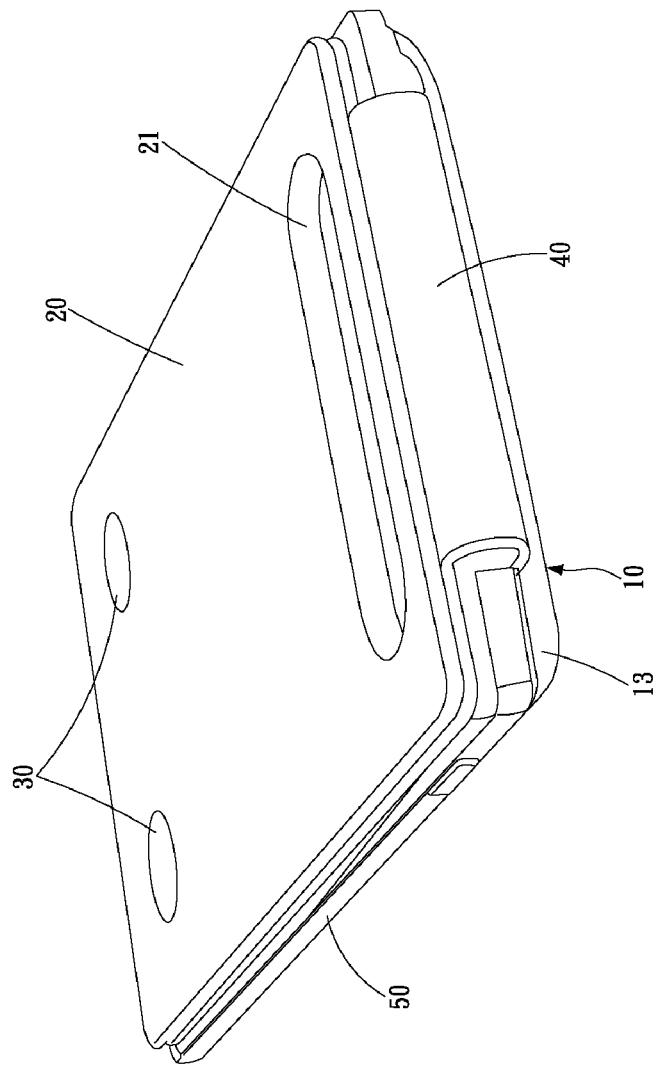
FIG. 8 is a schematic diagram showing a second embodiment of the electronic device according to the present invention.

Please refer to FIG. 8. FIG. 8 is a schematic diagram showing a second embodiment of the electronic device according to the present invention. The protective cover 20 further has a back cover 13, and the size of the back cover 13 is also provided corresponding to the size of the main body 10. The back cover 13 is connected with the connecting element 40. Accordingly, the protective cover 20, the connecting element 40 and the back cover 13 can be formed integrally, but the present invention is not limited thereto. The back cover 13 further comprises clips 14 to clip the electronic device 50 to clip the main body 10 and allow the main body 10 to be held on the back cover 13. The connecting element 40 is located at one side of the main body 10, and the protective cover 20 is located at the touch surface 11 of the main body 10 with respect to the back cover 13.

Please further refer to FIG. 6. The touch element 30 is disposed on the protective cover 20. When the protective cover 20 covers the touch surface 11, the location of the touch element 30 corresponds to the interface units 15 on the touch surface 11. The corresponding functions of the interface units 15 can be activated by exerting an external force on the touch element 30 so as to touch the interface units 15. For example, the interface unit 15 can be an answer key. When the protective cover 20 covers the touch surface 11, the touch element 30 can be pressed to touch the answer key to answer a call. The interface unit 15 also can be an end key, and the interface unit 15 is pressed to touch the end key to end the call.

Accordingly, the touch element 30 can be a resistive touch element or a capacitive touch element, and it is chosen according to different panels used for the touch surface 11 on the electronic device 50. The preferred manufacturing method of the resistive touch element and the capacitive touch element has been described as above, and thus it will not be described in details. However, the resistive touch element or the capacitive touch element are only embodiments, the present invention is not limited thereto.

The present invention is to protect the touch surface by the protective cover and utilize the touch element disposed thereon to touch the touch surface for directly activating the corresponding functions of the interface unit on the touch surface. When the protective cover covers the touch surface and the user wants to execute some functions, it can be executed directly without opening the protective cover for solving inconveniences of the prior protective cover.

Although the present invention has been described in considerable detail with reference to certain preferred embodiments thereof, the disclosure is not for limiting the scope of the invention. Persons having ordinary skill in the art may make various modifications and changes without departing from the scope and spirit of the invention. Therefore, the scope of the appended claims should not be limited to the description of the preferred embodiments described above.

What is claimed is:

1. A cover structure for an electronic device, and the electronic device further comprises a touch surface, comprising:
    a protective cover connected with the electronic device, wherein the protective cover is capable of being rotated with respect to the electronic device to a front side or a rear side of the electronic device;
    a touch element disposed at the protective cover; and
    wherein the protective cover further comprises a covering surface, and the covering surface further comprises a recessed portion for disposing the touch element;
    when the protective cover covers the touch surface, the covering surface faces the touch surface without touching, and the touch element can be exerted by an external force to touch the touch surface so as to activate corresponding functions of the electronic device.

2. The cover structure according to claim 1, further comprising a connecting element for connecting the protective cover on the electronic device.

3. The cover structure according to claim 2, further comprising a back cover connected with the connecting element, wherein the back cover is engaged with the electronic device for protecting the electronic device.

4. The cover structure according to claim 1, wherein the protective cover further comprises an opening for showing information of the electronic device.

5. The cover structure according to claim 4, wherein the protective cover further comprises a transparent plate to close the opening for protecting the electronic device.

6. The cover structure according to claim 1, wherein the touch element further comprises a resistive touch element or a capacitive touch element for touching the electronic device.

7. An electronic device, comprising:
a main body including a touch surface, wherein the touch surface includes an interface unit;
a protective cover connected with the main body, wherein the protective cover is capable of being rotated with respect to the main body to a front side or a rear side of the main body;
a touch element disposed at the protective cover corresponding to the interface unit; and
wherein the protective cover further comprises a covering surface, and the covering surface further comprises a recessed portion for disposing the touch element, and the covering surface faces the touch surface without touching when the protective cover covers the touch surface, and the touch element can be exerted by an external force to touch the touch surface so as to activate corresponding functions of the interface unit.

8. The electronic device according to claim 7, further comprising a connecting element for connecting the protective cover on the main body.

9. The electronic device according to claim 8, further comprising a back cover connected with the connecting element, wherein the back cover is engaged with the main body for protecting a rear surface of the main body.

10. The electronic device according to claim 9, wherein the back cover further comprises a clip for clipping and fixing the main body.

11. The electronic device according to claim 7, wherein the protective cover further comprises an opening for showing information of the touch surface.

12. The electronic device according to claim 11, wherein the protective cover further comprises a transparent plate to close the opening for protecting the touch surface.

13. The electronic device according to claim 7, wherein the touch element further comprises a resistive touch element or a capacitive touch element for touching the electronic device.

\* \* \* \* \*